US010141381B2

(12) United States Patent
Hsin et al.

(10) Patent No.: US 10,141,381 B2
(45) Date of Patent: Nov. 27, 2018

(54) ORGANIC LIGHT-EMITTING DIODE (OLED) ARRAY SUBSTRATE, METHOD OF MANUFACTERING THE SAME, AND RELATED DISPLAY APPARATUS

(71) Applicant: BOE TECHNOLOGY GROUP CO., LTD, Beijing (CN)

(72) Inventors: Lung Pao Hsin, Beijing (CN); Chang Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 288 days.

(21) Appl. No.: 15/031,225

(22) PCT Filed: Sep. 18, 2015

(86) PCT No.: PCT/CN2015/089928
§ 371 (c)(1),
(2) Date: Apr. 21, 2016

(87) PCT Pub. No.: WO2016/165278
PCT Pub. Date: Oct. 20, 2016

(65) Prior Publication Data
US 2018/0175120 A1    Jun. 21, 2018

(30) Foreign Application Priority Data

Apr. 13, 2015  (CN) .......................... 2015 1 0173298

(51) Int. Cl.
*G09G 3/32* (2016.01)
*H01L 27/32* (2006.01)
(Continued)

(52) U.S. Cl.
CPC ....... *H01L 27/3218* (2013.01); *G09G 3/3233* (2013.01); *H01L 27/3262* (2013.01);
(Continued)

(58) Field of Classification Search
None
See application file for complete search history.

(56) References Cited

U.S. PATENT DOCUMENTS

2004/0217694 A1   11/2004   Cok et al.
2009/0066867 A1   3/2009    Tsubata et al.
(Continued)

FOREIGN PATENT DOCUMENTS

CN        1551383 A      12/2004
CN        102956840 A    3/2013
(Continued)

OTHER PUBLICATIONS

The World Intellectual Property Organization (WIPO) International Search Report and Written Opinion for PCT/CN2015/089928 dated Dec. 31, 2015 p. 1-12.
(Continued)

*Primary Examiner* — Joseph Haley
(74) *Attorney, Agent, or Firm* — Anova Law Group, PLLC

(57) ABSTRACT

The present invention provides an organic light emitting diode (OLED) display array substrate, a manufacturing method of the same OLED structure and a display apparatus. The OLED array substrate includes a plurality of pixels arranged in an array on a base substrate. Further, each pixel comprises a first sub-pixel and a second sub-pixel displaying different colors. Each sub-pixel comprises a light emitting unit and a control circuit. In addition, an orthogonal projection of the light emitting unit of the first sub-pixel on the base substrate overlaps with an orthogonal projection of the control circuit of the second sub-pixel on the base substrate. According to the OLED display structure of the present disclosure, the region occupied by the control circuit of a second sub-pixel is used to set up the light emitting unit of the first sub-pixel. This can increase the display surface area
(Continued)

occupied by the light emitting units in each pixel, thus improve the resolution of the display.

13 Claims, 7 Drawing Sheets

(51) Int. Cl.
    *G09G 3/3233*     (2016.01)
    *H01L 51/52*     (2006.01)

(52) U.S. Cl.
    CPC . *H01L 51/5203* (2013.01); *G09G 2310/0264* (2013.01); *H01L 27/3213* (2013.01)

(56) References Cited

U.S. PATENT DOCUMENTS

| | | |
|---|---|---|
| 2012/0313093 A1 | 12/2012 | Kim et al. |
| 2013/0049032 A1 | 2/2013 | Tatsuya et al. |
| 2013/0063330 A1 | 3/2013 | Eom |
| 2013/0112960 A1 | 5/2013 | Chaji et al. |
| 2014/0001447 A1 | 1/2014 | Kim et al. |
| 2014/0159007 A1 | 6/2014 | Song et al. |
| 2014/0247200 A1 | 9/2014 | Jinta et al. |
| 2015/0090985 A1 | 4/2015 | Park et al. |
| 2016/0056213 A1* | 2/2016 | Kwak ................ G09G 3/3208 315/161 |
| 2016/0260781 A1 | 9/2016 | Yang et al. |
| 2017/0278915 A1* | 9/2017 | Jung ................ H01L 27/3246 |

FOREIGN PATENT DOCUMENTS

| | | |
|---|---|---|
| CN | 103000654 A | 3/2013 |
| CN | 103515540 A | 1/2014 |
| CN | 104037193 A | 9/2014 |
| CN | 104269431 A | 1/2015 |
| CN | 104716167 A | 6/2015 |
| KR | 20100043943 A | 4/2010 |
| KR | 20130004689 A | 1/2013 |
| KR | 20140077111 A | 6/2014 |
| WO | 2016165278 A1 | 10/2016 |

OTHER PUBLICATIONS

State Intellectual Property Office of the P.R.C (SIPO) Office Action 1 for 2015101732980 dated May 3, 2017 8 Pages.
Korean Intellectual Property Office (KIPO) Grant Notice for 20167031854 dated Feb. 20, 2018 3 Pages.

* cited by examiner

ORGANIC LIGHT-EMITTING DIODE (OLED) ARRAY SUBSTRATE, METHOD OF MANUFACTURING THE SAME, AND RELATED DISPLAY APPARATUS

CROSS-REFERENCES TO RELATED APPLICATIONS

This application is a national phase entry under 35 U.S.C. § 371 of International Application No. PCT/CN2015/089928, filed on Sep. 18, 2015, which claims priority to Chinese Patent Application No. 201510173298.0, filed on Apr. 13, 2015. The above enumerated patent applications are incorporated by reference herein in their entirety.

FIELD OF THE INVENTION

The present invention generally relates to the field of display technology and, more particularly, to an Organic Light Emitting Diode (OLED) array substrate, a method of manufacturing the same, and a related display apparatus.

BACKGROUND

Today, OLED devices have gradually become the mainstream in the display field. OLED devices present excellent characteristics, such as a low power consumption, a high color saturation, a wide viewing angle, a thin thickness and being available for flexible display, etc.

Generally, a color display of an OLED device may be realized by sub-pixels independently emitting red, green and blue (RGB) light, or through a white-light emitting OLED used in combination with color filters. Currently, the independent RGB-light emitting sub-pixels are the commonly used color display design used in many OLED devices.

An OLED is powered by the driving current. A control circuit composed of a plurality of thin film translators (TFTs) and capacitors is generally configured for each sub-pixel. The control circuit is configured to supply a stable current to a light emitting unit of the sub-pixel to control light emission. Because the control circuit occupies a rather large pixel area, in order to reduce the circuit disconnection risks between the control circuit and the light emitting unit, pixel defining layer materials are used to fill via holes of the pixels. To further keep the storage capacitance of the control circuit, a metal layer may also be added. However, the above improvements and other factors may reduce the aperture ratio of a pixel, thereby decreasing the resolution of the OLED display panel.

BRIEF SUMMARY OF THE DISCLOSURE

The present invention is directed to at least partially solve one or more problems set forth above. According to the disclosed embodiments of the present invention, an OLED device, a method of manufacturing the OLED device and a related display apparatus are provided. Embodiments of the present disclosure improve the aperture ratio of the pixel s in OLED display devices.

One aspect of the present invention provides an organic light emitting diode (OLED) display array substrate, a manufacturing method of the same OLED structure and a display apparatus. The OLED array substrate includes a plurality of pixels arranged in an array on a base substrate. Further, each pixel comprises a first sub-pixel and a second sub-pixel displaying different colors. Each sub-pixel comprises a light emitting unit and a control circuit. In addition, an orthogonal projection of the light emitting unit of the first sub-pixel on the base substrate overlaps with an orthogonal projection of the control circuit of the second sub-pixel on the base substrate.

Further, the orthogonal projection of the control circuit of the second sub-pixel on the base substrate covers the orthogonal projection of the first sub-pixel on the base substrate. The first sub-pixel is a white-light emitting sub-pixel and the first sub-pixel is located above the second sub-pixel.

Further, the second sub-pixel includes at least one of a green-light emitting sub-pixel, a red-light emitting sub-pixel, and a blue-light emitting sub-pixel. The green-light emitting sub-pixel and the red-light emitting sub-pixel are arranged side by side in a mirrored position.

Further, an area of the blue-light emitting sub-pixel is larger than an area of the green-light emitting sub-pixel or an area of the red-light emitting sub-pixel. Control circuits of the green-light emitting sub-pixel, the red-light emitting sub-pixel, and the blue-light emitting sub-pixel are in the middle of the pixel.

Further, within the pixel, the green-light emitting sub-pixel and the red-light emitting sub-pixel are arranged side by side in a mirrored position; and the blue-light emitting sub-pixel is arranged to be side by side in a mirrored position with a red-light emitting sub-pixel of an adjacent pixel. The first sub-pixel is located above the second sub-pixel.

Further, the control circuit of the first sub-pixel includes a bottom-gate Thin Film Transistor (TFT). The light emitting unit of the second sub-pixel includes in sequence a reflective layer, a transparent electrode layer, a light emitting layer, and a cathode layer. A gate layer of the bottom-gate TFT is formed of a same material as that of the reflective layer of the light emitting unit of the second sub-pixel.

Further, the light emitting unit of the second sub-pixel further includes a semiconductor layer in between the reflective layer and the transparent electrode layer. The semiconductor layer and an active layer of the bottom-gate TFT are formed of a same material. The semiconductor layer is an oxide layer.

Another aspect of the present disclosure provides a display panel comprising the OLED array substrate described above.

Another aspect of the present disclosure provides a method for manufacturing an OLED array substrate. The method includes forming the control circuit of the second sub-pixels on the base substrate; and forming the first sub-pixels sequentially, wherein an orthogonal projection of the light emitting unit of the first sub-pixel on the base substrate overlaps with an orthogonal projection of the control circuit of the second sub-pixel on the base substrate.

Further, the method includes forming the control circuit of the second sub-pixel on the base substrate; and forming the first sub-pixels sequentially, the orthogonal projection of the control circuit of the second sub-pixel on the base substrate covers the orthogonal projection of the first sub-pixel on the base substrate.

Further, the method includes forming a bottom-gate TFT to be the control circuit of the first sub-pixel; forming, in sequence, a reflective layer, a transparent electrode layer, a light emitting layer and a cathode layer to establish the light emitting unit of the second sub-pixel, wherein a gate layer of the bottom-gate TFT and the reflective layer of the light emitting unit of the second sub-pixel are formed in a same film forming process.

Further, the method includes forming a semiconductor layer located between the reflective layer and the transparent electrode layer of the light emitting unit of the second sub-pixel.

Further, the method includes forming a transparent electrode layer of the light emitting unit of the first sub-pixel.

Other aspects of the present disclosure can be understood by those skilled in the art in light of the description, the claims, and the drawings of the present disclosure.

DETAILED DESCRIPTION

In order for those skilled in the art to better understand the technical solutions of the present invention, the followings together with accompanying drawings describe in detail the present invention with specific embodiments.

Figure 1:
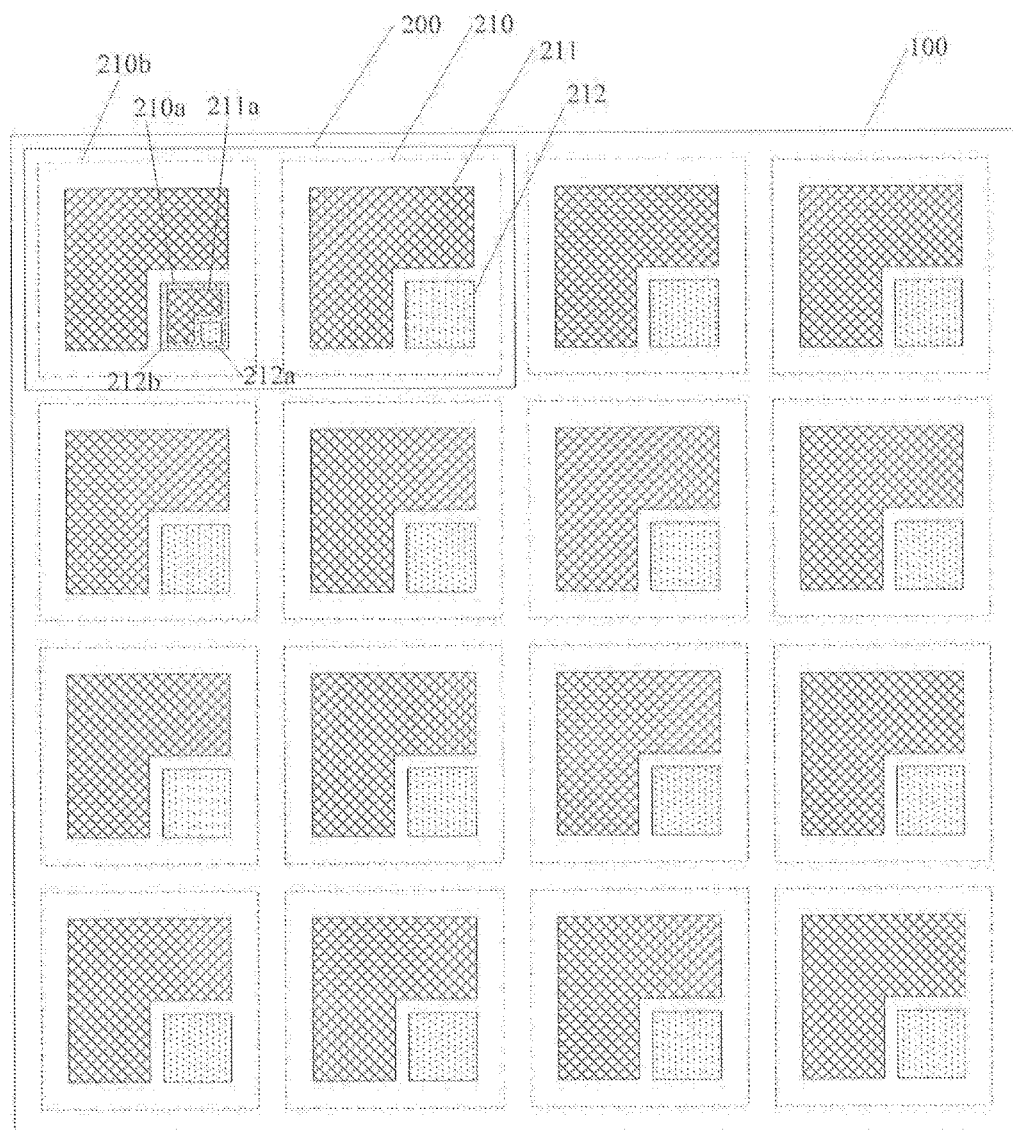
FIG. 1 illustrates a schematic top view of an exemplary OLED structure according to an embodiment of the present invention.

The present invention provides an OLED device. FIG. 1 illustrates a schematic top view of an exemplary OLED array substrate according to an embodiment of the present invention. As shown in FIG. 1, the OLED array substrate includes a plurality of pixels 200 arranged in an array on a base substrate 100. Each pixel 200 includes a first sub-pixel 210a and a second sub-pixel 210b displaying different colors.

As shown in FIG. 1, each pixel 200 includes three second sub-pixels 210 displaying respectively a different color. Each sub-pixel 210 further includes a light emitting unit 211 and a control circuit 212 to control the light emitting unit 211 to emit light. Within each pixel 200, an area occupied by the light emitting unit 211 of each sub-pixel 210 does not overlap with each other.

In addition, as shown in FIG. 1, an orthogonal projection of the first sub-pixel 210a on the base substrate 100 is located within an orthogonal projection area of the control circuit 212b of at least one second sub-pixel 210b.

According to the embodiments of the present invention, the light emitting unit 211a of the first sub-pixel 210a is located within the area where the control circuit 212b of at least one second sub-pixel 210b is located. The area proportion of the light emitting unit 211 in each pixel 200 can thus be increased to improve the aperture ratio of each pixel, which helps to improve the display resolution of the OLED display panel.

In the OLED array substrate according to the embodiments of the present invention illustrated in FIG. 1, within each pixel 200, the orthogonal projection of the light emitting unit 211a of the first sub-pixel 210a on the based substrate is located within the area in which the control circuit 212b of at least a second sub-pixel 210b is located. In addition, the orthogonal projection of the control circuit 212a of the first sub-pixel 210a is also located within the area where the control circuit 212b of at least a second sub-pixel 210b is located. As such, the space within each pixel 200 can be fully utilized.

Optionally, in an embodiment of the OLED device as shown in FIG. 1, the light emitting unit 211a of the first sub-pixel 210a is located only within the area in which the control circuit 212b of a second sub-pixel 210b is located. However, the limited area occupied by the control circuit 212b of the second sub-pixel 210b may also limit the area occupied by the light emitting unit 211a of the first sub-pixel 210a.

Figure 2:
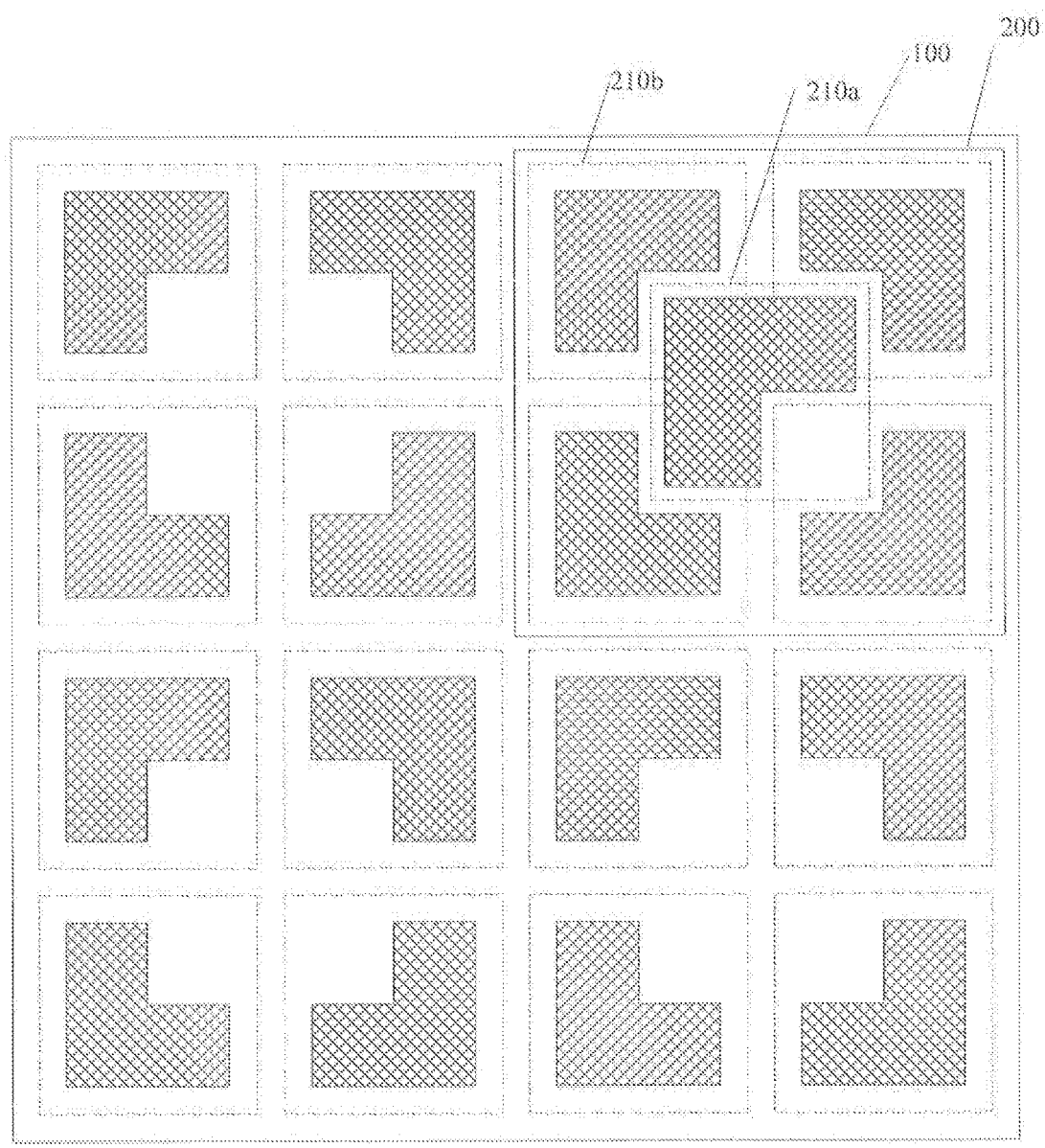
FIG. 2 illustrates a schematic top view of an exemplary OLED structure according to another embodiment of the present invention.

In another embodiment of the OLED device as shown in FIG. 2, the orientation of the light emitting unit 211b and the control circuit 212b of each second sub-pixel 210b within each pixel 200 are altered, so that the control circuits 212b of all second sub-pixel s 210b can be adjacent and be located in the middle of the pixel 200. The light emitting unit 211a of the first sub-pixel is placed in the middle of the pixel 200 to ensure that the light emitting unit 211a of the first sub-pixel 210a has a sufficient light emitting area.

In an OLED device, the light emitting unit of each sub-pixel is driven by the driving current to emit light, therefore, the power consumption is relatively large. In order to reduce the overall power consumption of the OLED device, a white-light emitting sub-pixel may be added in each pixel.

A white light emitted from the white-light emitting sub-pixel may completely replace a colored light which has the lowest proportion of the light emitted from the original monochromatic sub-pixels. The white light will also replace in part the other colored lights. Because the white color filter has high transmittance, the white-light emitting sub-pixel may not only effectively reduce the current consumption, but also maintain the color ratio of the lights emitted from each sub-pixel, so that the color gamut will not be decreased.

However, adding the white light emitting sub-pixel may take away the light emitting areas of other sub-pixels in the pixel, which may decrease the display resolution of the OLED display panel.

In the OLED array substrate of the present invention, for example, as shown in FIG. 2, the first sub-pixel 210a can be set as the white-light emitting sub-pixel. So the light emitting area of other monochromatic sub-pixels will not be affected. Thus, the disclosed embodiments of the OLED device reduce the power consumption of the OLED device while maintaining the display resolution.

By setting the first sub-pixel 210a as the white light emitting sub-pixel, the pixel may have a variety of structures.

Figure 3:
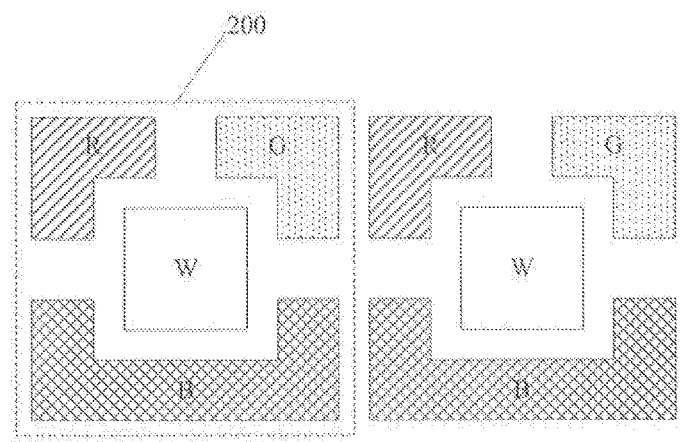
FIG. 3 illustrates a schematic top view of an exemplary OLED structure according to another embodiment of the present invention.

In one embodiment as illustrated in FIG. 3, the second sub-pixel 210b may be configured as a green-light emitting G sub-pixel, a red-light emitting R sub-pixel and a blue-light emitting B sub-pixel in each pixel 200. Wherein, the green-light emitting G sub-pixel and the red-light emitting R sub-pixel are placed side by side in a mirrored position.

Due to the low emitting efficiency of blue-light emitting material, the blue-light emitting sub-pixel can be configured to occupy a relatively large area, for example, an area equal to the sum of the area of the green-light emitting sub-pixel and the red-light emitting sub-pixel (B). The control circuits 212 of the green-light emitting sub-pixel, the red-light emitting sub-pixel and the blue-light emitting sub-pixel can be configured to be located in the middle of the pixel 200. Thus, the light emitting surface of the white-light emitting first sub-pixel may occupy a relatively large area (W).

Figure 4:
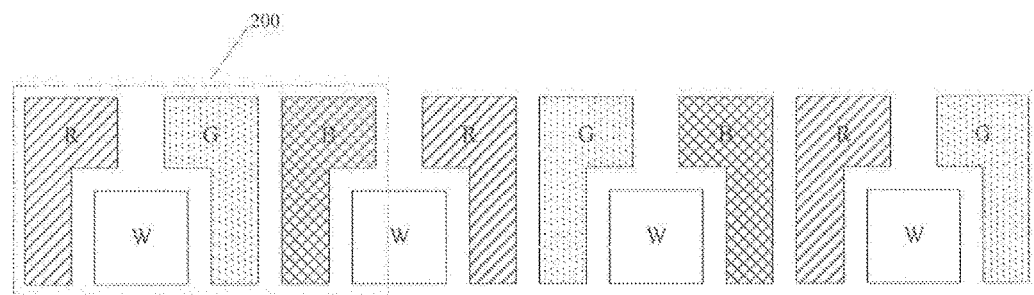
FIG. 4 illustrates a schematic top view of an exemplary OLED structure according to another embodiment of the present invention.

In another embodiment as illustrated in FIG. 4, the second sub-pixel 210b may be configured as the green-light emitting G sub-pixel, the red-light emitting R sub-pixel and the blue-light emitting B sub-pixel in each pixel 200. Two of the second sub-pixel s 210b (R and G) are configured to be side by side in a mirrored position. The other second sub-pixel 210b (B) is configured to be side by side in a mirrored position with a second sub-pixel 210b (R) of an adjacent pixel 200.

For example, as shown in FIG. 4, a green-light emitting G sub-pixel and a red-light emitting R sub-pixel are configured to be side by side in a mirrored position. Therefore, the light emitting surface of the light emitting unit of the white-light emitting first sub-pixel can occupy the area W between the green-light emitting G sub-pixel and the red-light emitting R sub-pixel.

Further, a blue-light emitting B sub-pixel is configured to be side by side in a mirrored position with a red-light emitting R sub-pixel of an adjacent pixel. Therefore, the light emitting surface of the light emitting unit of the white-light emitting first sub-pixel can occupy the area between the blue-light emitting B sub-pixel and the red-light emitting R sub-pixel.

For the convenience of illustration, the control circuit of each sub-pixel is not shown in FIG. 3 and FIG. 4. FIG. 3 and FIG. 4 only present an approximate schematic top view of the light emitting units.

Figure 5:
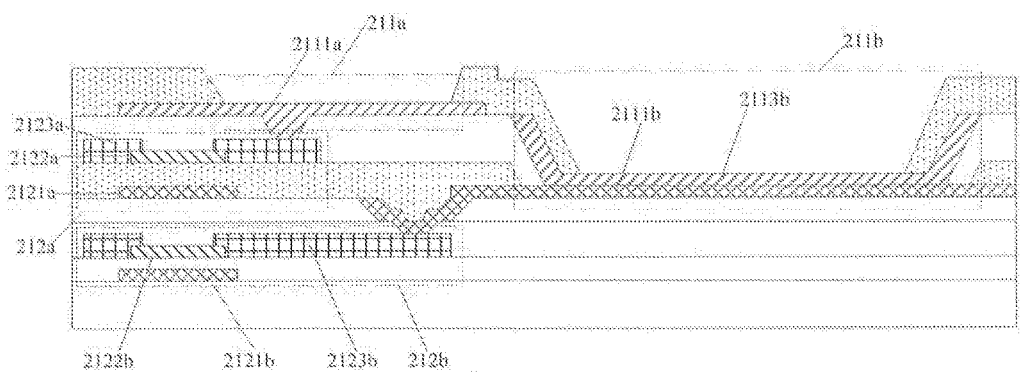
FIG. 5 illustrates a schematic side view of an exemplary OLED structure according to an embodiment of the present invention.
Figure 6:
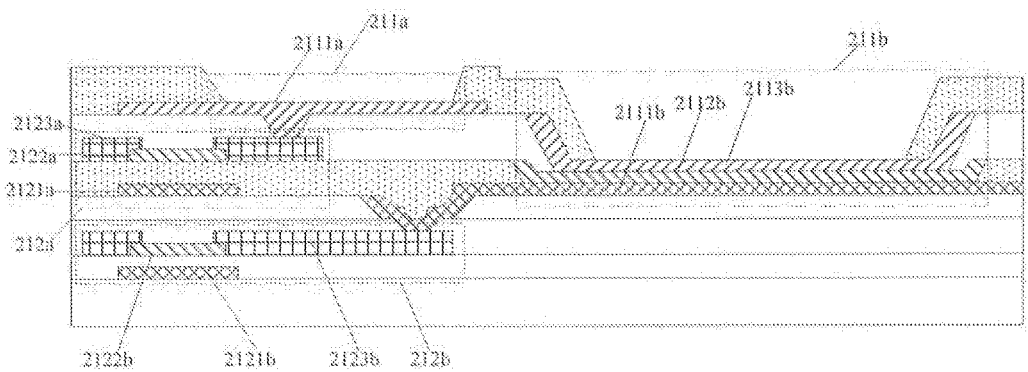
FIG. 6 illustrates another schematic side view of the exemplary OLED structure according to the embodiment of the present invention.

In the embodiments of the OLED array substrate according to present invention, in order to facilitate the implementation of placing the light emitting unit 211a of the first sub-pixel 210a within the area where the control circuit 212b of at least one second sub-pixel is located, a top emission structure may be used in fabricating the first sub-pixel 210a and the second sub-pixel 210b. Therefore, as shown in FIG. 5 and FIG. 6, the control circuit 212a and the light emitting unit 211a of the first sub-pixel 210a are configured to be above the film layer where the control circuit 212b of the second sub-pixel 210b is located. As a result, the light emitted from the light emitting unit 211a of the first sub-pixel 210a can exit the device from the top.

Specifically, the control circuit 212 of each sub-pixel 210 in each pixel generally includes a plurality of TFTs and capacitors. For the convenience of description, only one TFT is shown in FIG. 5 and FIG. 6.

Further, as shown in FIG. 5 and FIG. 6, the control circuit 212a of the first sub-pixel and the control circuit 212b of the second sub-pixel generally adopt a bottom-gate TFT structure. In other embodiments, the control circuit 212a of the first sub-pixel and the control circuit 212b of the second sub-pixel may both use a top-gate TFT structure, or a combination of the bottom-gate TFT and top-gate TFT structure.

As an example, the following describes an embodiment with both the control circuit 212a of the first sub-pixel and the control circuit 212b of the second sub-pixel using the bottom-gate TFT structure as shown in FIG. 5 and FIG. 6. The bottom-gate TFT included in the control circuit 212a of the first sub-pixel further includes a gate layer 2121a, an active layer 2122a and a source/drain layer 2123a, which are sequentially laminated. The bottom-gate TFT included in the control circuit 212b of the second sub-pixel further includes a gate layer 2121b, an active layer 2122b and a source/drain layer 2123b, which are sequentially laminated.

Further, since both the first sub-pixel and the second sub-pixel use the top emission structure, so the light emitting units of the first and second sub-pixels generally include a reflective layer, a transparent electrode layer, a light emitting layer and a cathode layer that are sequentially laminated. The reflective layer and the transparent electrode layer may be referred to together as an anode layer. FIG. 5 and FIG. 6 only show the transparent electrode layer 2111a of the light emitting unit 211a in the first sub-pixel and the reflective layer 2111b and the transparent electrode layer 2113b of the light emitting unit 211b in the second sub-pixel.

Furthermore, the control circuit 212b of the second sub-pixel and the control circuit 212a of the first sub-pixel are both configured to be below the light emitting unit 211a of the first sub-pixel. The source/drain layer 2123a in the control circuit 212a of the first sub-pixel and the source/drain layer 2123b in the control circuit 212b of the second sub-pixel are all opaque thin films. Instead of configuring an additional reflective layer for the light emitting layer 211a of the first sub-pixel, the source/drain layer 2123a and 2123b can also be configured and used as the reflective layers for the light emitting layer 211a of the first sub-pixel.

Further, the control circuit 212a of the first sub-pixel 210a and the light emitting unit 211b of the second sub-pixel 210b are all located above the film layer of the control circuit 212b of the second sub-pixel 210b. The bottom-gate TFT's gate layer 2121a in the control circuit 212a of the first sub-pixel and the reflective layer 2111b in the light emitting layer 211b of the second sub-pixel 210b can be formed of the same material and/or formed in the same filming forming process. Thus, the pattern for the top TFT's gate layer 2121a in the control circuit 212a of the first sub-pixel and the pattern for the reflective layer 2111b of the light emitting layer 211b of the second sub-pixel 210b can be formed at the same time through one patterning process. This may reduce certain manufacturing processing steps.

Further, the transparent electrode 2111a in the light emitting unit 211a of the first sub-pixel 210a and the transparent electrode 2113b in the light emitting unit 211b of the second sub-pixel 210b can be formed of the same material and/or formed in the same filming forming step. As shown in FIG. 5 and FIG. 6, the pattern for the transparent electrode 2111a in the light emitting unit 211a of the first sub-pixel 210a and the pattern for the transparent electrode 2113b in the light emitting unit 211b of the second sub-pixel 210b can be formed at the same time through one patterning step. This may reduce the number of manufacturing processing steps.

Further, the light emitting unit 211b of the second sub-pixel 210b, as shown in FIG. 6, may further include a semiconductor layer 2112b located in between the reflective layer 2111b and the transparent electrode layer 2113b. The semiconductor layer 2112b can be formed of the same material and/or formed in the same filming forming step, as the bottom-gate TFT's active layer 2122a of the first sub-pixel 210a. The semiconductor layer 2112b may be an oxide layer.

By adjusting the thickness of the semiconductor layer 2112b, the OLED device according to the embodiments of the present invention may control the length of the microcavity of the light emitting unit 211b of the second sub-pixel 210b. This may enable the fine-tune of the color gamut of the light emitting unit 211b of the second sub-pixel 210b.

The present invention also provides a method of manufacturing the OLED device as disclosed above. The manufacturing method includes the following steps.

First, a plurality of pixels arranged in an array are formed on a base substrate. Each pixel includes a plurality of sub-pixels. Each sub-pixel displays a different color. Each sub-pixel includes a light emitting unit and a control circuit to control the light emitting unit to emit light.

Within each pixel, an area where the light emitting unit of each sub-pixel is located does not overlap with each other. An orthogonal projection of the light emitting unit of a first sub-pixel on the base substrate is located within an orthogonal projection of the control circuit of at least a second sub-pixel.

In order to place the light emitting unit of the first sub-pixel within the orthogonal projection area in which the control circuit of at least a second sub-pixel is located, in general, both the first sub-pixel and the second sub-pixel may employ a top emission structure. Thus, the control circuit and the light emitting unit of the first sub-pixel can be formed after the control circuit of the second sub-pixel is formed on the base substrate.

Specifically, after the control circuit of the second sub-pixel is formed on the base substrate, the manufacturing method of the present invention further includes forming a bottom-gate TFT to establish the control circuit of the first sub-pixel. The method further includes forming, in sequence, a reflective layer, a transparent electrode layer, a light emitting layer and a cathode layer, to form the light emitting unit of the second sub-pixel. The gate layer of the bottom-gate TFT and the reflective layer of the light emitting unit of the second sub-pixel can be formed in a same film forming process.

Further, the transparent electrode layer of the light emitting unit of the second sub-pixel and the transparent electrode layer of the light emitting unit of the first sub-pixel may be formed in the same step.

Further, the active layer of the bottom-gate TFT and a semiconductor layer located in between the reflective layer and the transparent electrode layer of the light emitting unit of the second sub-pixel may be formed in the same step.

The following further describes detailed steps of the OLED manufacturing method.

Figure 7A:
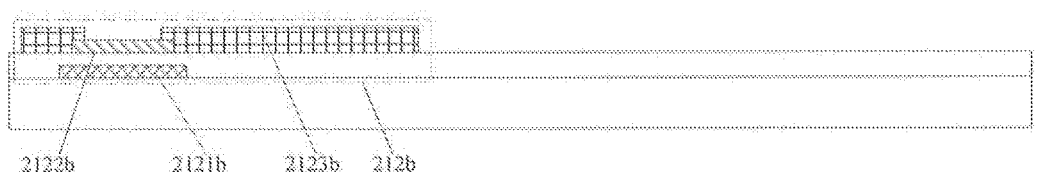
FIGS. 7a-g illustrate a schematic side view of the exemplary OLED structure illustrated in FIG. 6 after each processing step of the manufacturing process according to an embodiment of the present invention.

Step 1. The control circuit 212b of the second sub-pixel 210b is formed on the base substrate 100. Specifically, as shown in FIG. 7a, on the base substrate 100 (not shown), the gate layer 2121b, the active layer 2122b and the source/drain layer 2123b are formed in sequence to build the bottom-gate TFT in the control circuit 212b of the second sub-pixel 210b.

Figure 7B:
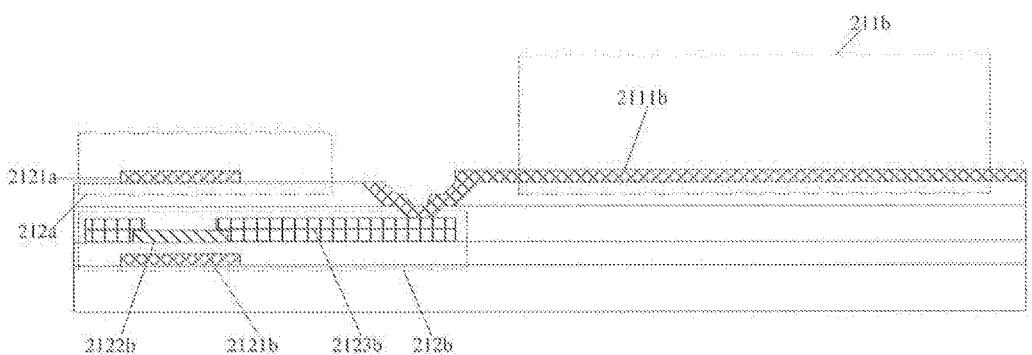

Step 2. Next, as shown in FIG. 7b, the reflective layer 2111b of the light emitting unit 211b of the second sub-pixel and the gate layer 2121a of the bottom-gate TFT in the control circuit 212a of the first sub-pixel 210a are formed on the same film layer in which the control circuit 212b of the second sub-pixel is located.

Figure 7C:
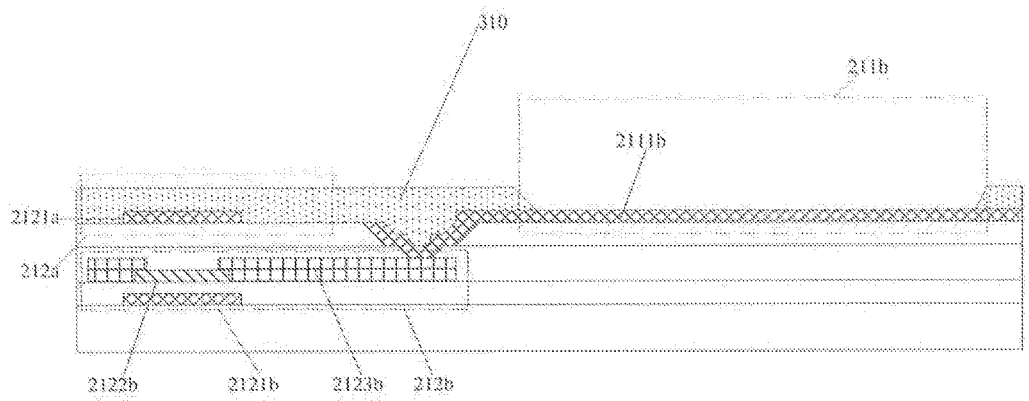

Step 3. As shown in FIG. 7c, a pixel defining layer 310 of the first sub-pixel is formed on the film layer where the reflective layer 2111b and the gate layer 2121a are located. The opening area of the pixel defining layer 310 of the first sub-pixel defines the light emitting area of the light emitting unit 211b of the second sub-pixel 210b. The pixel defining layer 310 of the first sub-pixel also acts as an insulating substance between the gate layer 2121a and the later-formed active layer 2122a.

Figure 7D:
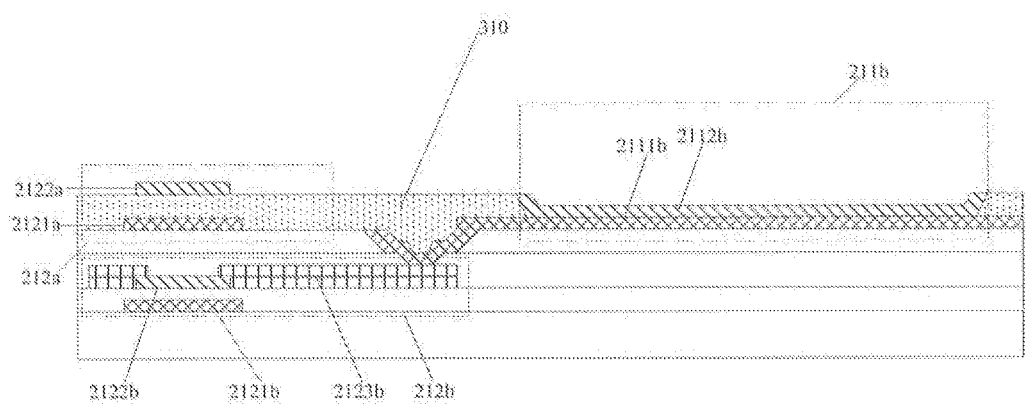

Step 4. As shown in FIG. 7d, on the pixel defining layer 310 of the first sub-pixel, the active layer 2122a of the bottom-gate TFT in the control circuit 212a of the first sub-pixel 210a and the semiconductor layer 2112b located on top of the reflective layer 2111b in the light emitting unit 211b of the second sub-pixel 210b are formed at the same time. The semiconductor layer 2112b may act as a cavity length control for the micro-cavity of the light emitting unit 211b.

Figure 7E:
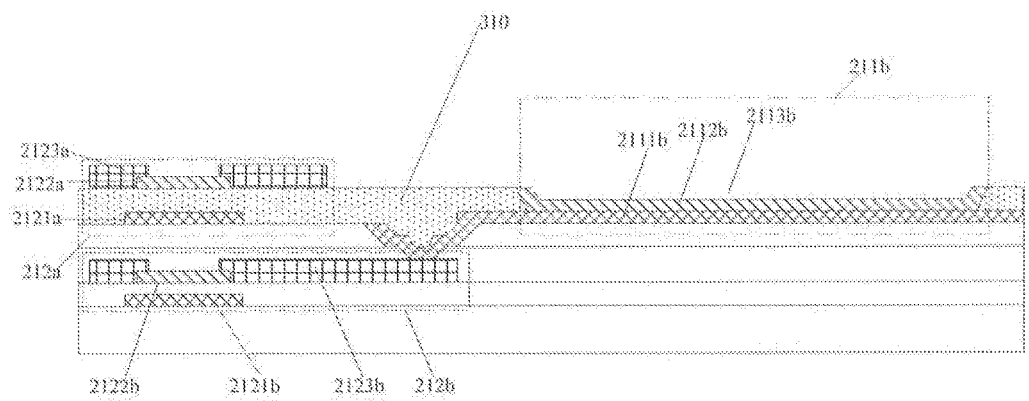

Step 5. As shown in FIG. 7e, the source/drain layer 2123a of the bottom-gate TFT in the control circuit 212a of the first sub-pixel 210a is formed.

Figure 7F:
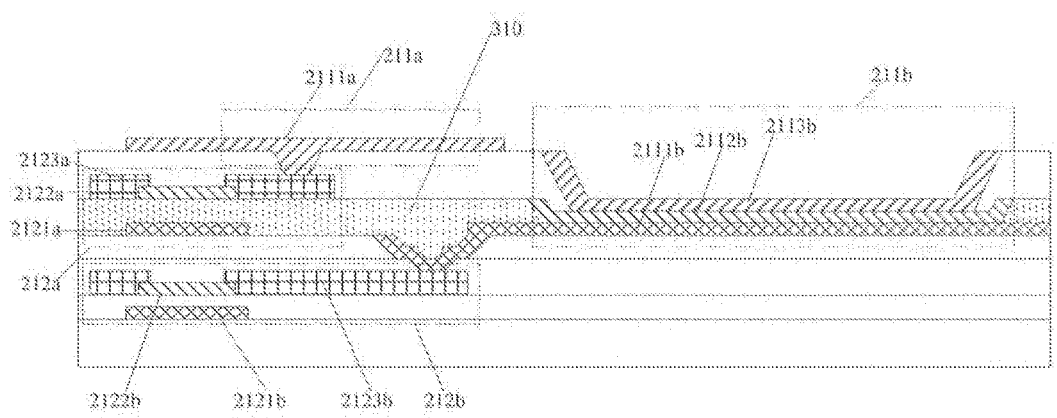

Step 6. As shown in FIG. 7f, the transparent electrode 2111a of the light emitting unit 211a of the first sub-pixel 210a and the transparent electrode 2113b of the light emitting unit 211b of the second sub-pixel 210b are formed at the same time on the base substrate.

Figure 7G:
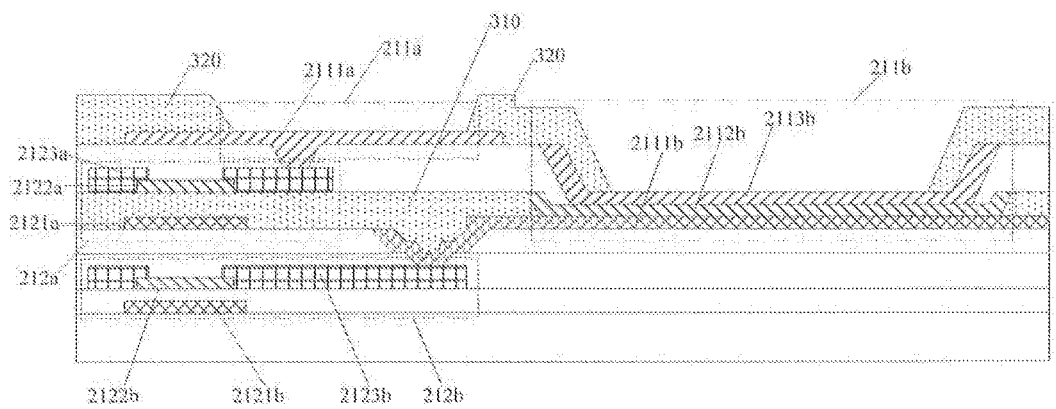

Step 7. As shown in FIG. 7g, a pixel defining layer 320 of the second pixel is formed on the substrate. The opening area of the pixel defining layer 320 of the second sub-pixel defines both the light emitting area of the light emitting unit 210a of the first sub-pixel and the light emitting unit 211b of the second sub-pixel 210b.

Further, the light emitting layers are formed respectively corresponding to the two opening areas. Finally, the cathode layers are formed. This completes the OLED manufacturing process.

Figure 8:
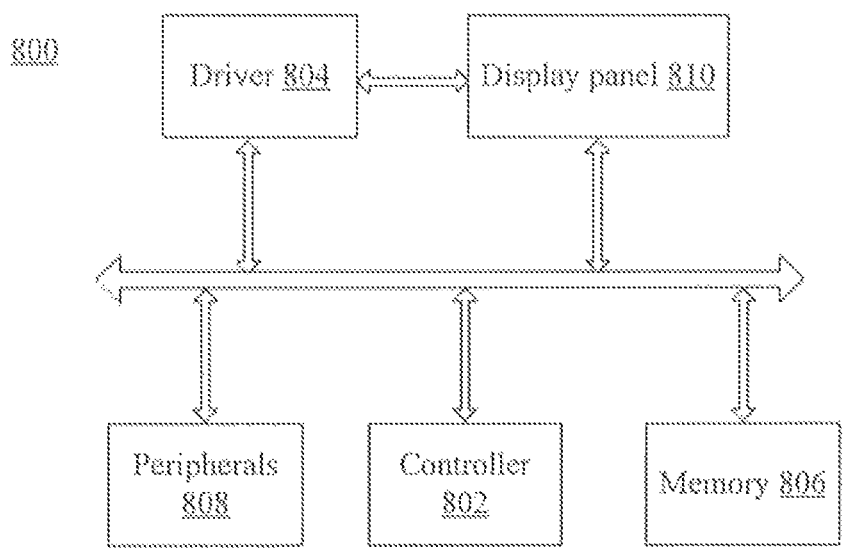
FIG. 8 illustrates a schematic block diagram of an exemplary display apparatus incorporating certain disclosed embodiments.

The present invention also provides a display apparatus. FIG. 8 illustrates an exemplary display apparatus 800 incorporating certain disclosed embodiments. The display apparatus 800 may be any appropriate device or component with certain display functions, such as a cell phone or smartphone, a tablet, a TV, a monitor, a laptop, a digital photo frame, or a navigation system, or any products or components with display functions, etc. As shown in FIG. 8, the display apparatus 800 includes a controller 802, a driving circuit 804, a memory 806, peripherals 808, and a display panel 810.

The controller 802 may include any appropriate processor or processors, such as an integrated microprocessor, digital signal processor, and/or graphic processor. Further, the controller 802 can include multiple cores for multi-thread or parallel processing. The memory 806 may include any appropriate memory modules, such as read-only memory (ROM), random access memory (RAM), flash memory modules, and erasable and rewritable memory, and other storage media such as CD-ROM, U-disk, and hard disk, etc. The memory 806 may store computer programs for implementing various processes, when executed by the controller 802.

Peripherals 808 may include any interface devices for providing various signal interfaces, such as USB, HDMI, VGA, DVI, etc. Further, peripherals 808 may include any input and output (I/O) devices, such as keyboard, mouse, and/or remote controller devices. Peripherals 808 may also include any appropriate communication module for establishing connections through wired or wireless communication networks.

The driving circuit 804 may include any appropriate driving circuits to supply power to the display panel 810. The display panel 810 may include any appropriate OLED display. During operation, the display 810 may be provided with image signals or other source data signals by the controller 802 and the driving circuit 804 for display.

The present disclosure provides embodiments of OLED devices, the manufacturing method of the OLED devices, and the display apparatus. Specifically, according to the present disclosure, a plurality of pixels are arranged in an array on a base substrate, each pixel includes a plurality of sub-pixel s with sub-pixels displaying different colors. Each sub-pixel consists of a light emitting unit and a control circuit to control the light emitting unit to emit light. Within each pixel, the area where each sub-pixel is located does not overlap with each other. The orthogonal projection of the light emitting unit of a first sub-pixel on the base substrate is located within the orthogonal projection area of the control circuit of at least a second sub-pixel.

According to the OLED device of the present invention, the light emitting unit of the first sub-pixel is configured and placed in the area where the control circuit of at least a second sub-pixel is located. Thus, the area proportionally occupied by the light emitting units in each pixel is increased to improve the aperture ration of each pixel. Thus, embodiments of the present disclosure help improve the resolution of the OLED device.

The embodiments disclosed herein are exemplary only and not limiting the scope of this disclosure. Various alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. An Organic Light Emitting Diode (OLED) array substrate, comprising:
    a plurality of pixels arranged in an array on a base substrate, wherein:
    each pixel comprises a first sub-pixel and a second sub-pixel displaying different colors;
    each sub-pixel comprises a light emitting unit and a control circuit; and
    an orthogonal projection of the control circuit of the second sub-pixel on the base substrate completely covers an orthogonal projection of the light emitting unit of the first sub-pixel on the base substrate.

2. The OLED array substrate according to claim 1, wherein the first sub-pixel is located above the second sub-pixel.

3. The OLED array substrate according to claim 1, wherein the first sub-pixel is a white-light emitting sub-pixel.

4. The OLED array substrate according to claim 1, wherein:
    the second sub-pixel includes at least one of a green-light emitting sub-pixel, a red-light emitting sub-pixel and a blue-light emitting sub-pixel.

5. An Organic Light Emitting Diode (OLED) array substrate, comprising:
    a plurality of pixels arranged in an array on a base substrate, wherein:
    each pixel comprises a first sub-pixel and a second sub-pixel displaying different colors;
    each sub-pixel comprises a light emitting unit and a control circuit; and
    an orthogonal projection of the light emitting unit of the first sub-pixel on the base substrate overlaps with an orthogonal projection of the control circuit of the second sub-pixel on the base substrate;
    the second sub-pixel includes at least one of a green-light emitting sub-pixel, a red-light emitting sub-pixel and a blue-light emitting sub-pixel; and
    within the pixel:
        the green-light emitting sub-pixel and the red-light emitting sub-pixel are arranged side by side in a mirrored position;
        an area of the blue-light emitting sub-pixel is larger than an area of the green-light emitting sub-pixel or an area of the red-light emitting sub-pixel; and
        control circuits of the green-light emitting sub-pixel, the red-light emitting sub-pixel, and the blue-light emitting sub-pixel are in the middle of the pixel.

6. The OLED array substrate according to claim 4, wherein within the pixel:
    the green-light emitting sub-pixel and the red-light emitting sub-pixel are arranged side by side in a mirrored position; and
    the blue-light emitting sub-pixel is arranged to be side by side in a mirrored position with a red-light emitting sub-pixel of an adjacent pixel.

7. An Organic Light Emitting Diode (OLED) array substrate, comprising:
    a plurality of pixels arranged in an array on a base substrate, wherein:
    each pixel comprises a first sub-pixel and a second sub-pixel displaying different colors;
    each sub-pixel comprises a light emitting unit and a control circuit; and
    an orthogonal projection of the light emitting unit of the first sub-pixel on the base substrate overlaps with an orthogonal projection of the control circuit of the second sub-pixel on the base substrate;
    the first sub-pixel is located above the second sub-pixel;
    the control circuit of the first sub-pixel includes a bottom-gate thin film transistor (TFT);
    the light emitting unit of the second sub-pixel includes in sequence a reflective layer, a transparent electrode layer, a light emitting layer, and a cathode layer; and
    a gate layer of the bottom-gate TFT is formed of a same material as that of the reflective layer of the light emitting unit of the second sub-pixel.

8. The OLED array substrate according to claim 7, wherein:
    the light emitting unit of the second sub-pixel further includes a semiconductor layer in between the reflective layer and the transparent electrode layer; and
    the semiconductor layer and an active layer of the bottom-gate TFT are formed of a same material.

9. The OLED array substrate according to claim 8, wherein the semiconductor layer is an oxide layer.

10. A display panel comprising the OLED array substrate according to claim 1.

11. A method for manufacturing the OLED array substrate according to claim 1, the method comprising: forming the control circuit of the second sub-pixels on the base substrate; and forming the first sub-pixels subsequently; forming a bottom-gate thin film transistor (TFT) to be the control circuit of the first sub-pixel; and forming, in sequence, a reflective layer, a transparent electrode layer, a light emitting layer and a cathode layer to establish the light emitting unit of the second sub-pixel, wherein a gate layer of the bottom-gate TFT and the reflective layer of the light emitting unit of the second sub-pixel are formed in a same film forming process.

12. The manufacturing method according to claim 11, further comprising:
    forming a semiconductor layer located between the reflective layer and the transparent electrode layer of the light emitting unit of the second sub-pixel.

13. The manufacturing method according to claim 11, further comprising:
   forming a transparent electrode layer of the light emitting unit of the first sub-pixel.

* * * * *